United States Patent [19]
Groenig

[11] Patent Number: 5,777,373
[45] Date of Patent: Jul. 7, 1998

[54] SEMICONDUCTOR STRUCTURE WITH FIELD-LIMITING RINGS AND METHOD FOR MAKING

[75] Inventor: Paul J. Groenig, Phoenix, Ariz.

[73] Assignee: Motorola, Inc., Schaumburg, Ill.

[21] Appl. No.: 767,438

[22] Filed: Dec. 16, 1996

Related U.S. Application Data

[63] Continuation of Ser. No. 489,658, Jun. 12, 1995, abandoned, which is a continuation of Ser. No. 177,818, Jan. 4, 1994, abandoned.

[51] Int. Cl.[6] ................................................ H01L 23/58
[52] U.S. Cl. ...................... 257/495; 257/488; 257/490
[58] Field of Search .............................. 257/337, 339, 257/341, 487, 488, 490, 491, 494, 495

[56] References Cited

U.S. PATENT DOCUMENTS

| | | | |
|---|---|---|---|
| 3,391,287 | 7/1968 | Kao et al. | 257/495 |
| 3,555,373 | 1/1971 | Kawana et al. | 257/495 |
| 3,763,406 | 10/1973 | Bosselaar | 257/490 |
| 3,909,119 | 9/1975 | Wolley | 257/487 |
| 4,055,884 | 11/1977 | Jambotkar | 257/341 |
| 4,399,449 | 8/1983 | Herman et al. | 257/490 |
| 4,414,560 | 11/1983 | Lidow | 257/125 |
| 4,573,066 | 2/1986 | Whight | 257/495 |
| 5,075,739 | 12/1991 | Davies | 257/170 |

FOREIGN PATENT DOCUMENTS 61-135158 6/1986 Japan ........................................ 257/495

*Primary Examiner*—Steven H. Loke
*Attorney, Agent, or Firm*—George C. Chen; Aaron B. Bernstein

[57] ABSTRACT

An improved edge termination scheme for semiconductor structures includes field-limiting rings (13, 14 and 15) having a fine-to-coarse incrementing scheme (18, 19 and 20) which is spatially additive assuring constancy against lateral junction variation. This spatially increasing scheme greatly enhances breakdown voltage characteristics. Additionally, redundant rings (14) are used to further guarantee insensitivity of the device to manufacturing variations. Reverse floating polysilicon flaps (28, 29 and 30) may be included to aid surface stability, when exposure to stray surface charges is anticipated. Additionally, this scheme provides for easy voltage scalability.

16 Claims, 1 Drawing Sheet

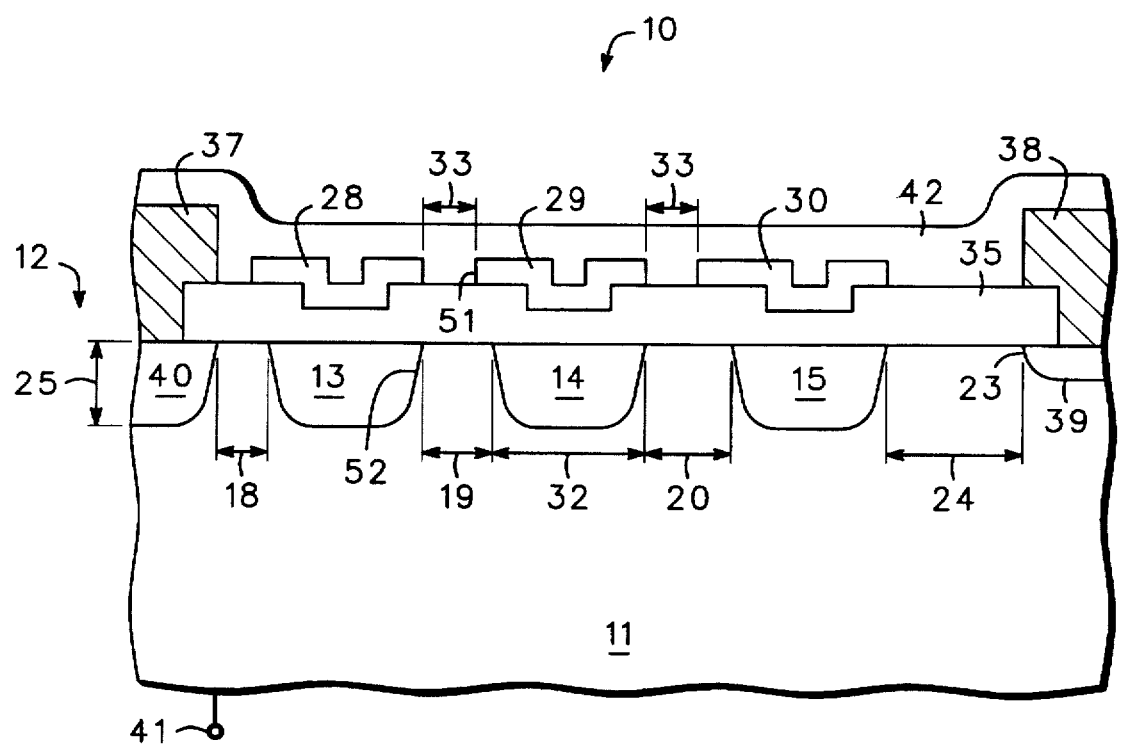

SEMICONDUCTOR STRUCTURE WITH FIELD-LIMITING RINGS AND METHOD FOR MAKING

This application is a continuation of prior application Ser. No. 08/489,658, filed Jun. 12, 1995, now abandoned, which is a continuation of prior application Ser. No. 08/177,818, filed Jan. 4, 1994, now abandoned.

BACKGROUND OF THE INVENTION

The present invention relates to semiconductor devices, and more particularly to semiconductor devices having field-limiting rings.

Many forms of high voltage edge terminations have evolved in the semiconductor device industry. Among them are field-limiting rings, field-spreading films, mesa structures, electric field plates and junction termination extensions. All of these approaches serve to address the same basic problem of maximum electric field relaxation of a planar junction. Each termination approach possesses a set of innate advantages and disadvantages, and the designer must attempt to minimize the negative aspects of an approach while simultaneously exploiting the positive aspects. Among these approaches, field-limiting rings are one of the least costly in regards to semiconductor device manufacturing investment, as the same diffusion step used to form the pn junction of the main device can often be used to form the field-limiting rings.

BRIEF DESCRIPTION OF THE DRAWINGS

The single FIGURE is a simplified partial cross-sectional view of the edge termination of an electronic device.

DETAILED DESCRIPTION OF THE DRAWING

Field-limiting rings, also referred to as guard rings, are typically concentric rings encircling the main body of a semiconductor device. Many variations of field-limiting rings have developed. Several basic features of ring-type structures provide the inspiration for these variations. Among these features are sensitivity to diffused junction depth, epitaxial layer doping, surface charge, and photo-etch control. The sensitivity to these effects all arise from the problem of optimal ring placement. That is, for a given diffused pn junction depth and doping, there exists an optimal placement of a single ring. The single ring argument can be extended to multiple ring structures. Surface charge and epitaxial doping are somewhat the same in regards to optimal ring placement, as both control the total charge that is contained from ring-to-ring. However, surface charge can be variable through the life of a semiconductor device while the epitaxial doping remains at a fixed value. Junction depth variation directly effects the placement of the ring, thereby reducing the value of the breakdown voltage. Photo-etch variation directly effects the ring-to-ring placement. An efficient ring structure must effectively address all of these issues.

The FIGURE is a simplified cross-section of the edge termination of an electronic device 10. The electronic device 10 may be, for example, a diode, MOSFET, IGBT, BJT, or some other typical semiconductor device. The main device body 12 of the device is not explicitly shown, but lies to the left of the portion shown, as indicated generally by the arrowed line associated with the reference number 12. Generally, the structure consists of a series of floating field-limiting rings (13, 14, 15) which are placed in a fine-to-coarse incremental spacing scheme concentrically around, and away from the main body 12. Electrical contact is made via electrodes 37, 38 and 41.

Focusing on the edge termination structure, the edge termination structure consists of a semiconductor region 11. Semiconductor region 11 includes several diffused elements, including a device body tub 40, an innermost floating field-limiting ring 13, and outermost floating ring 15, from zero to several remaining central floating field-limiting rings represented by field-limiting ring 14, and a channel-stopping region 39. Regions 11 and 39 are of the same conductivity type, while regions 40, 13, 14, and 15 are of a conductivity type opposite to that of 11 and 39. The diffused elements 40, 13, 14, and 15 have a junction depth 25. Junction depth 25 may typically be from 2.0 to 25.0 microns, and preferably between 2.5 and 7 microns. The diffused elements typically comprise a total impurity dose of 1e13 to 1e16 atoms/cm$^2$. Additionally, the field-limiting rings have a field-limiting ring width 32. The widths 32 must be sufficient to disturb the electric field profile, yet it is desirable to keep the width to a minimum to save silicon chip area. The width 32 is preferably wider than the junction depth 25. Additionally, preferably, all field-limiting rings have the same width 32.

Outermost field-limiting ring 15 is separated from the device edge 23 by a distance 24, which is a drawn mask dimension. The diffused depth of the channel-stopping region 39 may be any depth such as not to encroach significantly upon the drawn mask dimension of 24. The dose of channel-stopping region 39 should be of a magnitude capable of suppressing surface channeling, as will be understood by those skilled in the art.

The surface of semiconductor region 11 is passivated via a grown oxide layer 35. The total thickness of layer 35 is typically from 0.5 to 2.0 microns. Typically, 0.9 microns of layer 35 comprises an initial masking oxide thickness. Additionally, another 0.6 microns of layer 35 is provided for additional surface masking after the introduction of the dopants for formation of diffused elements 40, 13, 14 and 15.

Windows may be etched in oxide layer 35 to form body tub 40 and field-limiting rings 13,14 and 15. This type of processing results in the notches seen over each ring. Alternatively, the windows may be formed with photoresist mask only, but in this case no notches would be formed.

The preferred embodiment of the present device includes reverse polysilicon flaps 28, 29 and 30. Polysilicon flaps 28, 29 and 30 overlie oxide layer 35, such that oxide layer 35 is between flaps 28, 29 and 30 and field-limiting rings 13, 14 and 15, respectively. Polysilicon flaps 28, 29 and 30 are similar in layout to field-limiting rings 13, 14 and 15, in that they are concentric rings surrounding main device body area 12, and surrounding each other. Polysilicon flaps 28, 29 and 30 are only loosely coupled via capacitance to field-limiting rings 13, 14 and 15, respectively. Flaps 28, 29 and 30 are typically from 0.1 to 1.0 micron thick, may be of any conductivity type, and serve to reduce the effects of stray surface charges. The direction of poly flaps 28, 29 and 30 is best if primarily poised so as to be reverse-directed toward the main device body 12. In contrast, severe reductions in breakdown voltage may result in a forward-directed flap structure if the ring spacing scheme is kept identical to the reverse-directed case. The distances 33 between the polysilicon flaps must be present to permit the escape of electric field lines into space. Preferably, the inside edge of the poly flap (which will be recognized to be the edge 51 of the polysilicon flap 29 toward the main device body 12) is place a distance of 3 microns from the outside edge of the previous field-limiting ring (which will be recognized to be the edge 52 of the field-limiting ring 13 away from the main device body 12). A 5–7 micron flap-to-flap distance 33 has also been acceptable. Preferably, the flap-to-flap distance 33 is the same throughout the device.

Electrical contact to semiconductor region 11 is made via electrodes 38 and 41. Electrical contact to device tub 40 is made via electrode 37. Electrodes 38 and 41 would typically be at the same bias condition in a diode, MOSFET or BJT type of structure, but would differ by some amount in an IGBT type of structure due to the presence of a potential barrier at contact 41 for the injection of minority carriers into region 11. The entire surface of the edge termination structure of electronic device 10 is typically covered by a final passivation layer 42. Final passivation layer 42 may be a deposited chemical vapor thin film such as a doped oxide, or it may be a passivation which is spun onto the surface, such as a polyimide. Openings are made using understood processing techniques, in the final passivation layer 42 for electrical contact to electrode 37 somewhere on the device body 12. Additionally, openings may be provided for electrical contact to electrode 38 in some special cases.

The innermost field-limiting ring 13 is separated from the main body 40 by a distance 18, designated $\Delta_1$. $\Delta_1$ is preferrably less than the diffused junction depth 25 of the main body tub 40 into the semiconductor region 11, the junction depth being designated $X_J$. As previously discussed, field-limiting ring region 14 represents a plurality of such remaining field-limiting rings. In the preferred embodiment, the remaining field-limiting rings are separated from their nearest field-limiting ring in the direction of the device body (e.g. ring 13, with respect to ring 14) by distance 19. In the case of multiple rings 14, each distance 19 is greater in succession than the previous distance 19 (moving toward to the edge 23 of the device) by some constant additive amount, the minimum distance of 19 being greater than distance 18 by the same constant additive amount. The respective distances 19 are designated $\Delta_2$ through $\Delta_{f-2}$, where f is equal to the total number of field-limiting rings 14 plus one. The outermost field-limiting ring 15 is separated from the last of the central rings 14 by a distance 20, designated $\Delta_{f-1}$, which is greater than the final distance 19 of the central rings 14 by the same constant additive amount. Channel-stopping region 39 is separated from the last field ring 15 by a distance 24, designated $\Delta_f$, which is somewhat greater than distance 20. A notable characteristic of the described configuration is that a linearly increasing ring-to-ring incrementing scheme is used. A linear or additive scheme guarantees achieving the desired ring separation over a range of lateral diffusion variation, whereas a geometrically increasing scheme cannot—the multiplicative factor would vary with the lateral diffusion. Increments of 1.0 to 1.5 microns from ring-to-ring are desirable for most cases.

Distance 20 ($\Delta_{f-1}$) is determined by the optimal distance, designated $\Delta'_{f-1}$, for a single floating ring and a main body diffusion, plus the inclusion of non-mask junction-to-junction variational causes such as diffused junction depth and photoresist critical dimension and oxide etch variation. The minimum possible value of distance 20 would be the optimal distance of a single floating ring from a main junction assuming perfect knowledge of a semiconductor manufacturing process having zero causes of variation, this being done so as to obtain the absolute maximum breakdown voltage, assuming the minimum value of surface charge. In order to encompass the effects of processing variation, the actual distance 20 is made to be somewhat greater than the theoretical value, such that the actual minimum manufactured distance 20 approaches the theoretically optimum single-ring placement distance. The processing variations give rise to the need for redundant rings to permit attainment of a consistently high percentage of the bulk breakdown voltage. These redundant rings are typically contained within the central rings 14 having spaces 19 that increase in value away from the device body 12.

Distance 24, designated $\Delta_f$, has an acceptable minimum to maximum range. The maximum value of distance 24 is such that the depletion edge of a single reverse-biased pn junction with no field-limiting rings at breakdown can be contained within the distance given by the one-dimensional Poisson equation for voltage. The minimum distance is such that the value of the previously mentioned case is not significantly altered. It has been found that for cases in the 250–1200 V range, between 20 and 40 microns is an adequate value for distance 24.

To maximize the breakdown voltage of electronic device 10, the total of distances 18, 19, 20 and 24 are such that for a given doping value and theoretical one-dimensional maximum breakdown voltage of the semiconductor region 11, the one-dimensional Poisson equation solved for distance, $$X_v = \left[ \frac{2(BV)(\epsilon_s)}{qN_D} \right]^{\frac{1}{2}}$$

should very nearly be satisfied, where $X_V$ is the sum of distances 18, 19, 20 and 24, BV is the theoretical one-dimensional breakdown voltage of the vertical main body 12 doping profile, $\epsilon_s$ is the permittivity of the semiconductor, q is the electronic charge constant, and $N_D$ is the doping of region 11. The term "very nearly" is used with respect to the Poisson equation due to the voltage supported on the diffused regions 13, 14 and 15 sides of the pn junctions, combined with the fact that distance 24 may be somewhat less than its maximum necessary value without significant impact upon the net breakdown voltage.

By now it should be appreciated that an improved edge termination scheme for semiconductor structures has been provided. More specifically, field-limiting rings having a fine-to-coarse incrementing scheme which is spatially additive assures constancy against lateral junction variation. This spatially increasing scheme greatly enhances breakdown voltage characteristics. Additionally, redundant rings are used to further guarantee insensitivity of the device to manufacturing variations. Reverse floating polysilicon flaps may be included to aid surface stability, when exposure to stray surface charges is anticipated. Additionally, this scheme provides for easy voltage scalability.

I claim:

1. A semiconductor device comprising:
    a semiconductor region including a device body;
    a plurality of substantially concentric field-limiting rings including an innermost field-limiting ring, an outermost field-limiting ring, and at least one remaining field-limiting ring between the innermost field-limiting ring and the outermost field-limiting ring, the plurality of substantially concentric field-limiting rings formed in the semiconductor region surrounding the device body, a first edge of the innermost field-limiting ring laterally separated from an edge of the device body by a distance $\Delta_1$, a first edge of the one remaining field-limiting ring or a first edge of each of a plurality of remaining field-limiting rings laterally separated from a second edge of its respective nearest substantially concentric field-limiting ring toward a direction of the device body by respective distances $A_2$ through $A_{f-2}$ when f is greater than four, said first edge of the one remaining field-limiting ring laterally separated from a second edge of the innermost field-limiting ring by distance $A_2$ when f equals four, f being the total number of the plurality of substantially concentric field-limiting rings plus one, f-2 being the one remaining field-limiting ring or the total number of the remaining field-limiting rings plus one, a first edge of the outermost field-limiting ring being separated from a second edge of its nearest remaining field-limiting ring toward the direction of the device body by a distance $A_{f-1}$, wherein the distances $A_1$ through $A_{f-1}$ are increasing by a constant additive amount; and a channel-stopping region having an edge separated from a second edge of the outermost field-limiting ring toward the direction of the device body by a distance $A_f$, wherein the sum of the distances $A_1$ through $A_f$ substantially equals $X_V$, $X_V$ being defined as:

$$X_v = \left[ \frac{2(BV)(\epsilon_s)}{q N_D} \right]^{\frac{1}{2}}$$

and wherein BV is a breakdown voltage of the semiconductor device, $\epsilon_s$ is a permittivity of the semiconductor region, q is the electronic charge constant, and $N_D$ is a doping of the semiconductor region.

2. The semiconductor device of claim 1 wherein each of the plurality of substantially concentric field-limiting rings has a ring width wherein the ring widths are substantially equal to each other.

3. The semiconductor device of claim 2 wherein each of the concentric field-limiting rings has a ring depth wherein the ring depths are substantially equal to each other.

4. The semiconductor device of claim 3 wherein the ring depths are approximately equal to a depth of the device body.

5. The semiconductor device of claim 4 wherein the ring depths are less than the respective ring widths.

6. The semiconductor device of claim 1 wherein distance $A_f$ is in the range of approximately 20–40 micrometers.

7. The semiconductor device of claim 1 further including a plurality of polysilicon flaps, each of the plurality of polysilicon flaps overlying one of the plurality of concentric field-limiting rings.

8. The semiconductor device of claim 7 further comprising an oxide layer between the plurality of concentric field-limiting rings and the plurality of polysilicon flaps.

9. The semiconductor device of claim 8 wherein the polysilicon flaps are devoid of direct physical contact with the plurality of concentric field-limiting rings.

10. The semiconductor device of claim 9, wherein the polysilicon flaps are separated from one another by a substantially equal distance.

11. The semiconductor device of claim 9, wherein the polysilicon flaps are separated from one another by a range of approximately 5–7 micrometers.

12. A semiconductor device comprising:

a semiconductor region including a device body;

a plurality of substantially concentric field-limiting rings including an innermost field-limiting ring, an outermost field-limiting ring, and at least one remaining field-limiting ring between the innermost field-limiting ring and the outermost field-limiting ring, the plurality of substantially concentric field-limiting rings each having a field-limiting ring width substantially equal to each other and a junction depth substantially equal to each other, the plurality of substantially concentric field-limiting rings formed in the semiconductor region surrounding the device body, a first edge of the innermost field-limiting ring laterally separated from an edge of the device body by a distance $A_1$, a first edge of the one remaining field-limiting ring or a first edge of each of a plurality of remaining field-limiting rings laterally separated from a second edge of its respective nearest substantially concentric field-limiting ring toward a direction of the device body by respective distances $A_2$ through $A_{f-2}$ when f is greater than four, said first edge of the one remaining field-limiting ring laterally separated from a second edge of the innermost field-limiting ring by distance $A_2$ when f equals four, f being the total number of the plurality of substantially concentric field-limiting rings plus one, f-2 being the one remaining field-limiting ring or the total number of the remaining field-limiting rings plus one, a first edge of the outermost field-limiting ring being separated from a second edge of its nearest remaining field-limiting ring toward the direction of the device body by a distance $A_{f-1}$, wherein the distances $A_1$ through $A_{f-1}$ are increasing by a constant additive amount;

a channel-stopping region having an edge separated from a second edge of the outermost field-limiting ring toward the direction of the device body by a distance $A_f$, wherein the sum of the distances $A_1$ through $A_f$ substantially equals $X_V$, $X_V$ being defined as:

$$X_v = \left[ \frac{2(BV)(\epsilon_s)}{q N_D} \right]^{\frac{1}{2}}$$

and wherein BV is a breakdown voltage of the semiconductor device, $\epsilon_s$ is a permittivity of the semiconductor region, q is the electronic charge constant, and $N_D$ is a doping of the semiconductor region; and a plurality of reverse polysilicon flaps, each of the plurality of reverse polysilicon flaps overlying one of the plurality of substantially concentric field-limiting rings.

13. The device of claim 12, wherein the field-limiting ring width is greater than the junction depth.

14. The device of claim 12, wherein the plurality of reverse polysilicon flaps are separated from one another by a substantially equal distance.

15. The device of claim 14, wherein the plurality of reverse polysilicon flaps are separated from one another by a distance in the range of 5–7 microns.

16. A method for making a semiconductor device, comprising:

providing a semiconductor region;

forming a device body in the semiconductor region;

forming a doped region in the semiconductor region; and forming a plurality of substantially concentric field-limiting rings, including an innermost field-limiting ring, an outermost field-limiting ring, and at least one remaining field-limiting ring between the innermost field-limiting ring and the outermost field-limiting ring, the plurality of substantially concentric field-limiting rings formed in the semiconductor region surrounding the device body, each of the plurality of substantially concentric field-limiting rings having a junction depth substantially equal to each other, a portion of each of the plurality of substantially concentric field-limiting rings located between the device body and an edge region, a first edge of the innermost field-limiting ring laterally separated from an edge of the device body by a distance $\Delta_1$, a first edge of the one remaining field-limiting ring or a first edge of each of a plurality of remaining field-limiting rings laterally separated from a second edge of its respective nearest substantially concentric field-limiting ring toward a direction of the device body by respective distances $\Delta_2$ through $\Delta_{f-2}$ when f is greater than four, said first edge of the one remaining field-limiting ring laterally separated from a second edge of the innermost field-limiting ring by distance $\Delta_2$ when f equals four, f equaling the total number of the plurality of substantially concentric field-limiting rings plus one, f-2 equaling the one remaining field-limiting ring or the total number of the remaining field-limiting rings plus one, a first edge of the outermost field-limiting ring being separated from a second edge of its nearest remaining field-limiting ring toward the direction of the device body by a distance $\Delta_{f-1}$, and a second edge of the outermost field-limiting ring being separated from an edge of the doped region toward a direction away from the device body by a distance $\Delta_f$, wherein the distances $\Delta_1$ through $\Delta_{f-1}$ are increasing by a constant additive amount, wherein the sum of the distances $\Delta_1$ through $\Delta_f$ substantially equals $X_V$, $X_V$ being defined as:

$$X_v = \left[ \frac{2(BV)(\epsilon_s)}{q N_D} \right]^{\frac{1}{2}}$$

and wherein BV is a breakdown voltage of the semiconductor device, $\epsilon_s$ is a permittivity of the semiconductor region, q is the electronic charge constant, and $N_D$ is a doping of the semiconductor region.

* * * * *